(12) United States Patent
Idesawa et al.

(10) Patent No.: US 6,335,523 B1
(45) Date of Patent: Jan. 1, 2002

(54) SEMICONDUCTOR DARK IMAGE POSITION SENSITIVE DEVICE

(75) Inventors: Masanori Idesawa, Saitama; Toyomi Fujita, Tanashi; Yasushige Yano, Wako, all of (JP)

(73) Assignee: Riken, Saitama (JP)

( * ) Notice: Subject to any disclaimer, the term of this patent is extended or adjusted under 35 U.S.C. 154(b) by 0 days.

(21) Appl. No.: 09/442,504

(22) Filed: Nov. 18, 1999

(30) Foreign Application Priority Data

Nov. 20, 1998 (JP) ................................................. 10-330362

(51) Int. Cl.$^7$ ..................................................... H01L 31/00
(52) U.S. Cl. ......................................... 250/214.1; 327/514
(58) Field of Search .............................. 250/214.1, 214 R, 250/208.1, 208.4; 327/514; 358/474

(56) References Cited

U.S. PATENT DOCUMENTS 3,984,677 A * 10/1976 Hosoe et al. ............... 250/214 P
4,900,135 A * 2/1990 Yuasa et al. ................ 359/241

* cited by examiner

Primary Examiner—Stephone B. Allen

(57) ABSTRACT

A semiconductor dark image position sensing device comprises a photoelectric layer generating a photoelectric current in a portion where light is input in response to intensity of the light input, a resistive element layer into which the photoelectric current generated in the photoelectric layer flows from a portion corresponding to the position of light input, a second resistive element disposed in association with the photoelectric layer for replenishing an insufficient amount of electric current with respect to the photoelectric current so as to flow the same into the resistive element layer in such that a distribution of electric current flowing into the resistive element layer corresponding to the position of light input becomes substantially uniform over a whole sensing region, and signal electric current output terminals disposed at the opposite ends of the second resistive element.

2 Claims, 7 Drawing Sheets

SEMICONDUCTOR DARK IMAGE POSITION SENSITIVE DEVICE

BACKGROUND OF THE INVENTION

1. Field of the Invention

The present invention relates to a semiconductor dark image position sensitive device, more particularly to a semiconductor dark image position sensitive device for sensing an image position of dark point image such as dark target point (dark image position) existing in a bright background, and especially to a semiconductor dark image position sensitive device which is applied to a non-contact optical positioning sensor in a variety of automated systems or a variety of optical measuring devices, so that it is suitable for realizing a sensing system or a measuring system which can sense easily a dark image position in a bright background at high-speed.

2. Description of the Related Art

Heretofore, a semiconductor image position sensitive device has been known as a sensor for sensing easily at high speed an image position of spot (bright point) such as bright target point existing in a dark background.

In general, a semiconductor image position sensitive device is composed of a photoelectric layer, a dividing resistive element layer laminated on the photoelectric layer, and signal current output terminals connected to the dividing resistive element layer. Such semiconductor image position sensitive device is constituted on the basis of such a basic principle that when light irradiated from a spot is input to the photoelectric layer, a photoelectric current is generated in the photoelectric layer, the photoelectric current thus generated in the photoelectric layer is allowed to flow into the dividing resistive element layer, whereby the photoelectric current distributed in response to a resistance value between an inflow portion of the photoelectric current in the dividing resistive element layer and the signal current output terminals is settled, and a center-of-gravitational position of incident light into the photoelectric layer is calculated based on a value of photoelectric current.

A conventional semiconductor image position sensitive device constituted on the basis of the above described basic principle will be explained in detail herein by referring to the accompanying drawings.

Namely, FIG. 1 is a conceptual view showing the structure of a conventional semiconductor image position sensitive device, and FIG. 2 is a conceptual diagram of an equivalent circuit exhibiting a principle of the calculation for sensing an image position in the semiconductor image position sensitive device of FIG. 1 wherein the semiconductor image position sensitive device comprises a P-type semiconductor layer P, an insulator layer I laminated on the bottom side of the P-type semiconductor layer P, an N-type semiconductor layer N laminated on the bottom side of the insulator layer P, a resistive element layer $R_P$ for calculating an image position and which is laminated on the surface side of the P-type semiconductor layer P, a signal current output terminal A as well as a signal current output terminal B formed on the opposite ends of the resistive element layer $R_P$ on the surface side thereof, and a bias terminal C formed on the bottom side of the N-type semiconductor layer N at the central portion thereof.

In the above described semiconductor position sensitive device S, a photoelectric layer S is formed from the P-type semiconductor layer P, the insulator layer I, and the N-type semiconductor layer N, while the dividing resistive element layer is formed from the resistive element layer $R_P$.

In such semiconductor image position sensitive device as described above, when light L is irradiated from the surface side of the resistive element layer $R_P$, photoelectric current generated in the photoelectric current layer S at an incident position of the light L flows into the resistive element layer $R_P$, the photoelectric current thus flowed into the resistive element layer $R_P$ is distributed in response to a resistance value defined between a position at which the photoelectric current flowed into the resistive element layer $R_P$ and the signal current output terminals A and B, whereby output signal currents $I_A$ and $I_B$ are output from the signal current output terminals A and B, respectively (see FIG. 2). It is to be noted that reference character $I_C$ designates a bias current output to the bias terminal C.

In this case, when it is supposed that resistivity of the resistive element layer $R_P$ is constant, the resistance value is proportional to a distance defined between the position at which photoelectric current is flowed into the resistive element layer $R_P$ and the signal current output terminals A and B, so that information X at an incident position of the light L (being equivalent to a ratio of dislocation from the central position of the resistive element layer $R_P$) is determined by an equation (1):

$$x=(I_A-I_B)/(I_A+I_B) \tag{1}$$

In the meantime, it is constituted in such that the photoelectric current layer S is continuous, and the resistive element layer $R_P$ being a dividing resistance for calculating an image position is formed as a thin film superposed on the photoelectric layer S in the semiconductor image position sensitive device shown in FIGS. 1 and 2.

However, it is not so easy that the resistive element layer $R_P$ being a dividing resistance for calculating an image position is formed stably as a uniform thin film having a predetermined resistivity, and as a result, such resistivity cannot be made constant, whereby a distribution of the resistivity becomes scattered, so that there is a problem that the scattering becomes a factor of an error in sensing for image position.

In order to solve such problem as described above, devised is a semiconductor image position sensitive device of separate photoelectric device type wherein a photoelectric layer is fabricated as a separate photoelectric layer of a dividing structure separated into plural sections being independent of a dividing resistive element layer, while the dividing resistive element layer is fabricated stably as a constriction resistance at a position away from the separate photoelectric layer, and photoelectric currents generated in the separate photoelectric layer having a structure which has been separated and divided individually into sections are allowed to flow condensedly into positions corresponding to the dividing resistive element layers.

FIG. 3 is a conceptual diagram of an equivalent circuit exhibiting a principle of such semiconductor image position sensitive device of a separate photoelectric device type as described above.

In FIG. 3, reference character Sg designates a separate photoelectric layer in the semiconductor image position sensitive device of separate photoelectric device type. According to the semiconductor image position sensitive device of separate photoelectric device type as described above, a resistive element layer $R_P$ can be stably fabricated as a dividing resistance for calculating an image position, whereby errors in sensing an image position is allowed to decrease, so that it is possible to improve stability in sensing an image position.

Furthermore, a photoelectric current generated by irradiating the light L in any structure in any semiconductor image position sensitive device as described above shown in FIGS. 1 through 3 is output from the signal current output terminal A as an output signal electric current $I_A$, while it is output from the signal current output terminal B as an output signal current $I_B$ (see FIGS. 2 and 3). Accordingly, when a calculation is made on the basis of the equation (1) by applying the output signal currents $I_A$ and $I_B$, it becomes possible to calculate a position of spot image by means of an analog arithmetic circuit at extremely high-speed.

Meanwhile, any of the above described semiconductor image position sensitive device is the one for sensing an image position of a spot (bright point) existing in a dark background, and it could not sense a position of dark point image existing in a bright background.

In other words, a gravitational position of all the light L projected to a sensing region of light is calculated, but not the brightest point of a spot image in a conventional semiconductor image position sensitive device based on the principle as described above. Namely, a semiconductor image position sensitive element which can sense a position of bright point emitting light in a dark background becomes widely used.

However, such a device which can sense easily a dark image position of a dark point image existing in a bright background at high-speed has not been realized until now.

In this respect, a method for sensing a dark image position of dark point image wherein the dark point image is brought into an information processing means as an image by means of a solid image pickup device or the like, and the dark image position of dark point image is sensed by utilizing an image processing technique in order to sense the dark image position of dark point image existing generally in a bright background has been applied. There is, however, such a problem that a sensing speed is slow in the conventional method as described above.

For this reason, it has been strongly desired to devise a device which can sense easily at high-speed a dark image position of dark point image such as a dark target point existing in a bright background.

OBJECTS AND SUMMARY OF THE INVENTION

The present invention has been made in view of a strong demand which has existed heretofore as described above. An object of the invention is to provide a semiconductor dark image position sensitive device which is arranged to be able to sense easily at high-speed a dark image position of dark point image such as a dark target point existing in a bright background by means of a conventional semiconductor position sensitive device as in the case of sensing a bright point position.

In order to achieve the above described object, a semiconductor dark image position sensitive device according to the present invention comprises a photoelectric layer generating a photoelectric current in response to light input, a resistive element layer into which the photoelectric current generated in the photoelectric layer flows at a position corresponding to that of the light input, a second resistive element being a replenishing means for replenishing an insufficient amount of electric current for the photoelectric current in such that an electric current distribution of the photoelectric current flowing into the resistive element layer becomes substantially uniform, whereby a position of dark point image such as a dark target point existing in a bright background can be sensed easily at high-speed.

It is herein arranged in such that an electric current for replenishing an insufficient amount of the photoelectric current is supplied from a portion corresponding to a position at which a photoelectric current in the second resistive element flows, and the electric current for replenishing an insufficient amount of the photoelectric current is distributed at a rate in response to a resistance value defined between a portion of supplying an electric current for replenishing an insufficient amount of the photoelectric current on the second resistive element and signal current output terminals positioned at opposite ends of the second resistive element, so that it is output from the signal current output terminals as an electric current which is summed over the whole region of a section to which is supplied an insufficient amount of the photoelectric current.

Then, when a signal electric current sensed by means of the signal current output terminals is calculated as in a conventional semiconductor image position sensitive device, a position of dark point image such as a dark target point existing in a bright background can be sensed easily at high-speed.

Now, a principle of the above described semiconductor dark image sensitive device will be described hereinafter. A photoelectric layer of the semiconductor dark image sensitive device may be considered to be a kind of an electric current source (high internal resistance) in which a photoelectric current flows in response to an amount of light, so that if a resistance value of a second resistive element as a replenishing means for replenishing an insufficient amount of photoelectric current and which is to be connected to the outside is in a smaller range than that of the internal resistance, the photoelectric current has a value determined by a quantity of light input irrespective of a resistance value of the second resistive element.

Accordingly, a voltage in a portion where a photoelectric current flows into the resistive element layer has a value in response to the photoelectric current.

On one hand, when a situation where an electric current is applied to the portion where a photoelectric current flows into the resistive element layer through a second resistive element as the above described replenishing means is considered, an amount of electric current to be applied from the second resistive element becomes large in a portion where a small amount of photoelectric current flows thereinto, while an amount of electric current to be applied becomes small in a portion where a large amount of photoelectric current flows thereinto, in other words, an electric current having a complementary distribution with respect to a distribution of photoelectric current is applied, and such electric current is supplied from the opposite ends of the second resistive element being the above described replenishing means.

Thus, when a signal electric current from signal current output terminals positioned at the opposite ends of the above described sensing section is sensed, and then, the same arithmetic computations are performed as that of a conventional semiconductor image position sensing device, a gravitational position of dark point image such as a dark target point existing in a bright background can be calculated.

For this reason, according to a semiconductor dark image position sensing device of the present invention, it becomes possible to sense easily at high-speed a dark point image position such as a dark target point existing in a bright background on the basis of the same principle as that of a conventional semiconductor image position sensing device, and in this respect such sensing of a dark point image position existing in a bright background has been heretofore impossible. As a result, it becomes possible to apply a semiconductor dark image position sensing device according to the present invention to a variety of instrumentation systems.

Namely, a semiconductor dark image position sensing device according to the present invention comprises a photoelectric layer generating a photoelectric current in a portion where light is input in response to intensity of the light input, a resistive element layer into which the above described photoelectric current generated in the above described photoelectric layer flows from a portion corresponding to the above described position of light input, a second resistive element disposed in association with the above described photoelectric layer for replenishing an insufficient amount of electric current with respect to the above described photoelectric current so as to flow the same into the resistive element layer in such that a distribution of electric current flowing into the above described resistive element layer corresponding to the above described position of light input becomes substantially uniform over a whole sensing region, and signal electric current output terminals disposed at the opposite ends of the above described second resistive element; wherein the electric current for replenishing an insufficient amount of the above described photoelectric current is supplied from a portion corresponding to a position where the above described photoelectric current in the above described second resistive element flows into the above described resistive element layer, the electric current for replenishing an insufficient amount of the above described photoelectric current is distributed at a ratio in response to a resistance value defined between a portion for supplying the electric current for replenishing an insufficient amount of the above described photoelectric current on the above described second resistive element and the above described signal current output terminals, and the electric current is output from the signal electric current output terminals as an electric current which is summed over the whole region of a section to which is supplied the electric current for replenishing an insufficient amount of the above described photoelectric current.

Furthermore, the semiconductor dark image position sensitive device according to the present invention as described in the above paragraph, wherein it is arranged in such that a site of the above described photoelectric layer in which a photoelectric current is generated in response to intensity of light is separated into plural portions and each of which acts as an independent photoelectric device, and photoelectric currents generated in the above described photoelectric devices separated into the plural portions flow into the above described resistive element layers corresponding to respective positions.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

In the following, an example of preferred embodiments of a semiconductor dark image position sensitive device according to the present invention will be described in detail in conjunction with the accompanying drawings.

Figure 1:
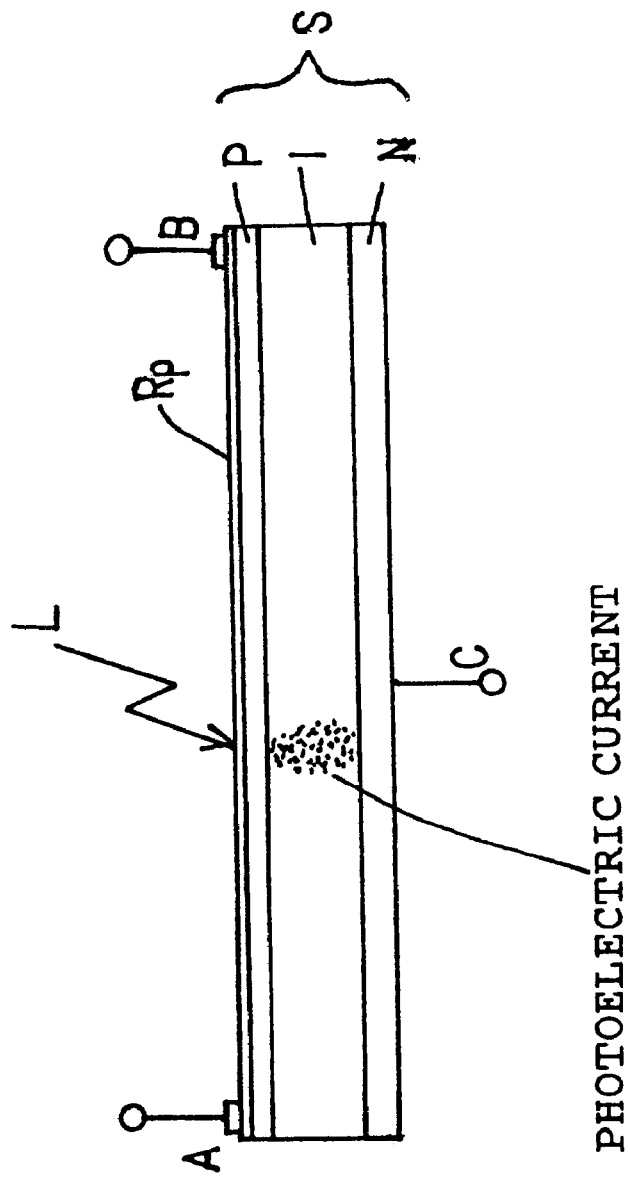
FIG. 1 is a conceptual view showing a constitution of a conventional semiconductor image position sensitive device.
Figure 2:
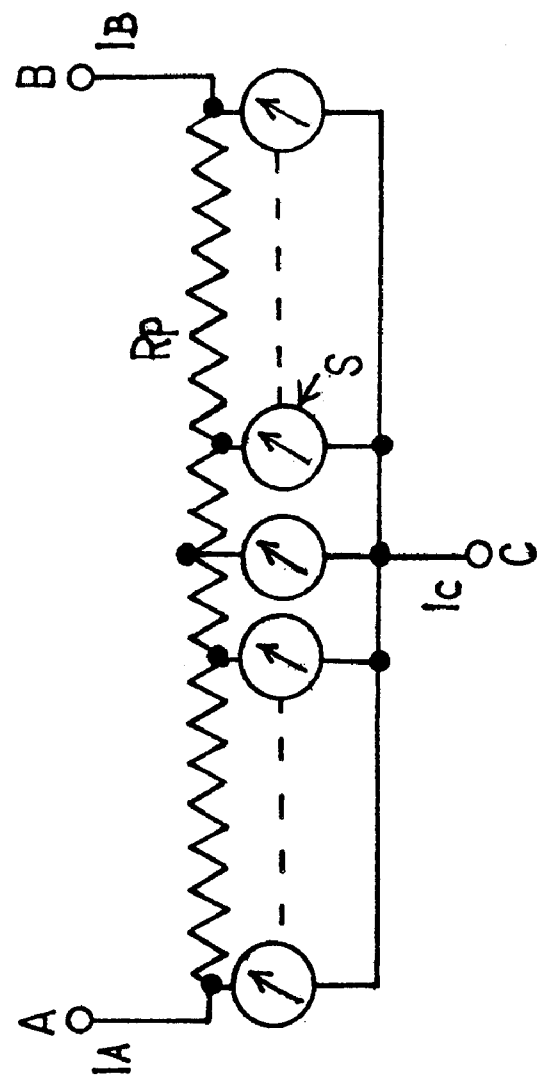
FIG. 2 is a conceptual diagram showing an equivalent circuit exhibiting a principle of image position sensing calculation in the semiconductor image position sensitive device of FIG. 1.
Figure 3:
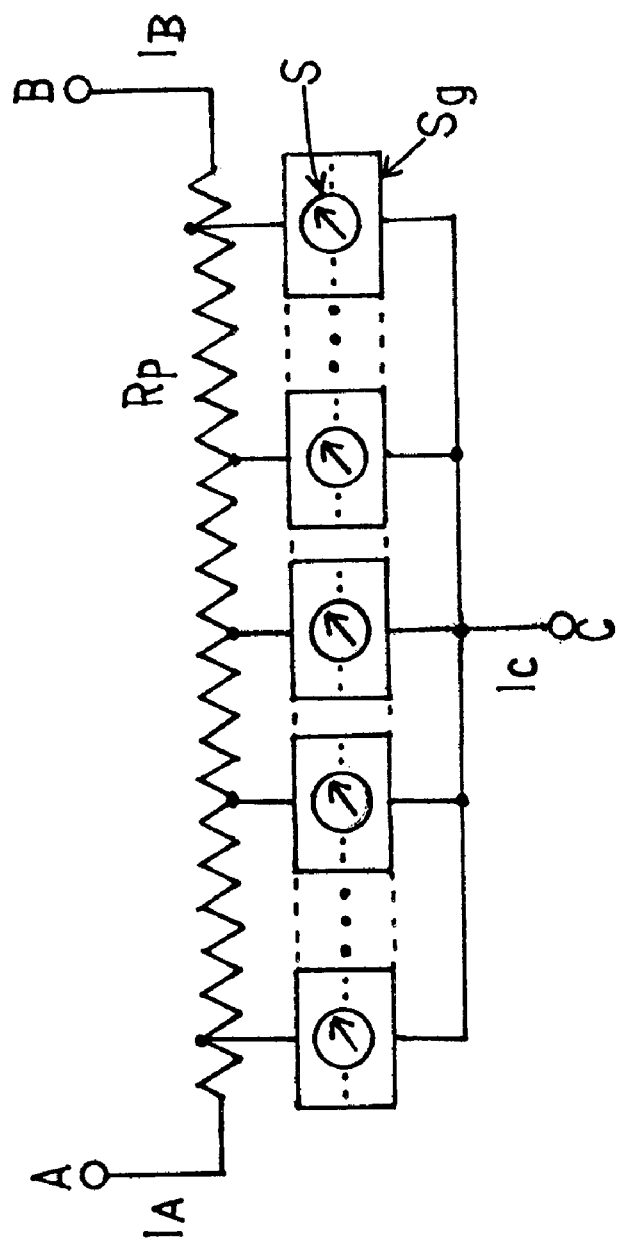
FIG. 3 is a conceptual diagram showing an equivalent circuit exhibiting a principle of a semiconductor image position sensitive device of a separate photoelectric device type.
Figure 4:
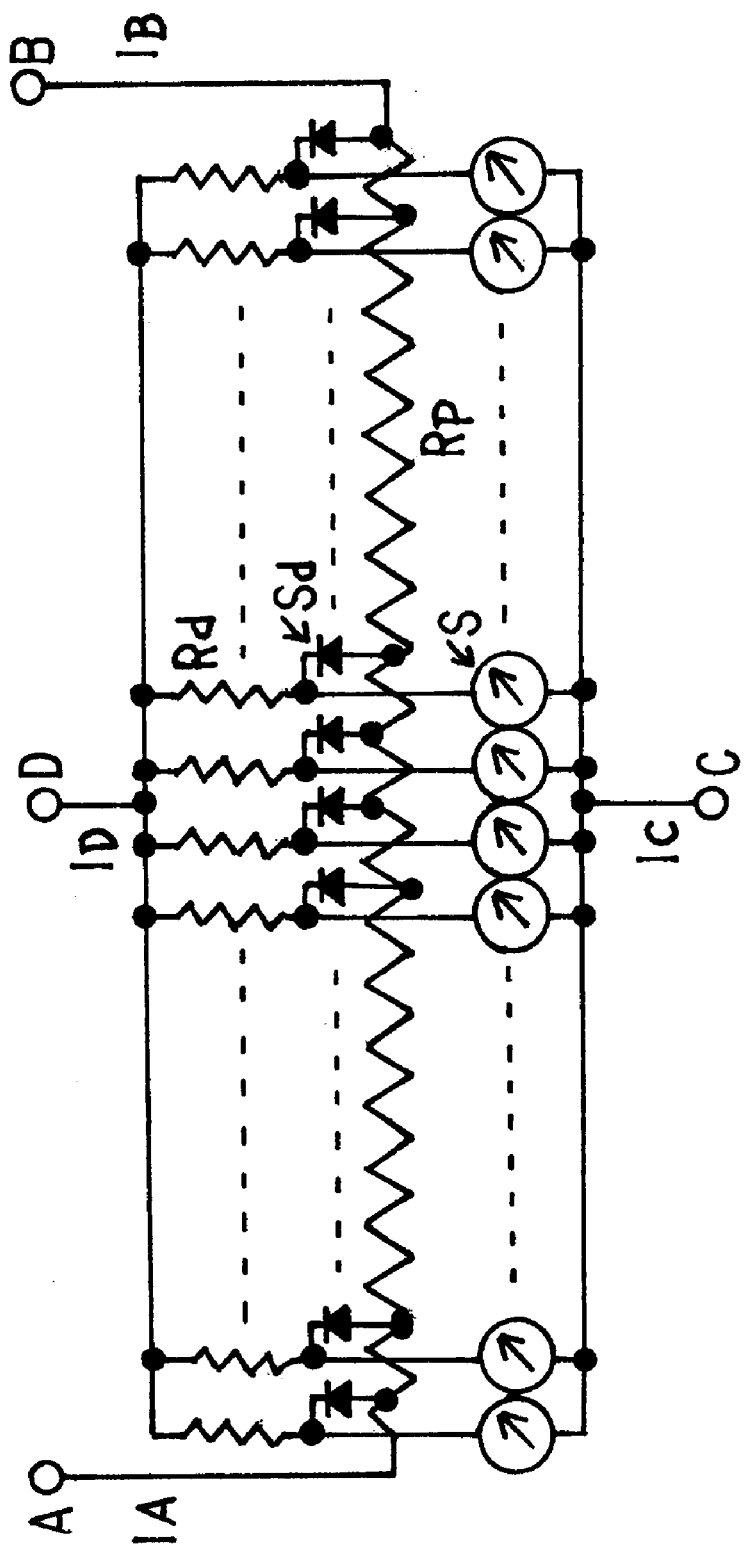
FIG. 4 is a conceptual diagram showing an example of equivalent circuit exhibiting a principle of a semiconductor dark image position sensitive device according to the present invention wherein the semiconductor dark image position sensitive device is the one of a continuous photoelectric device type.
Figure 5:
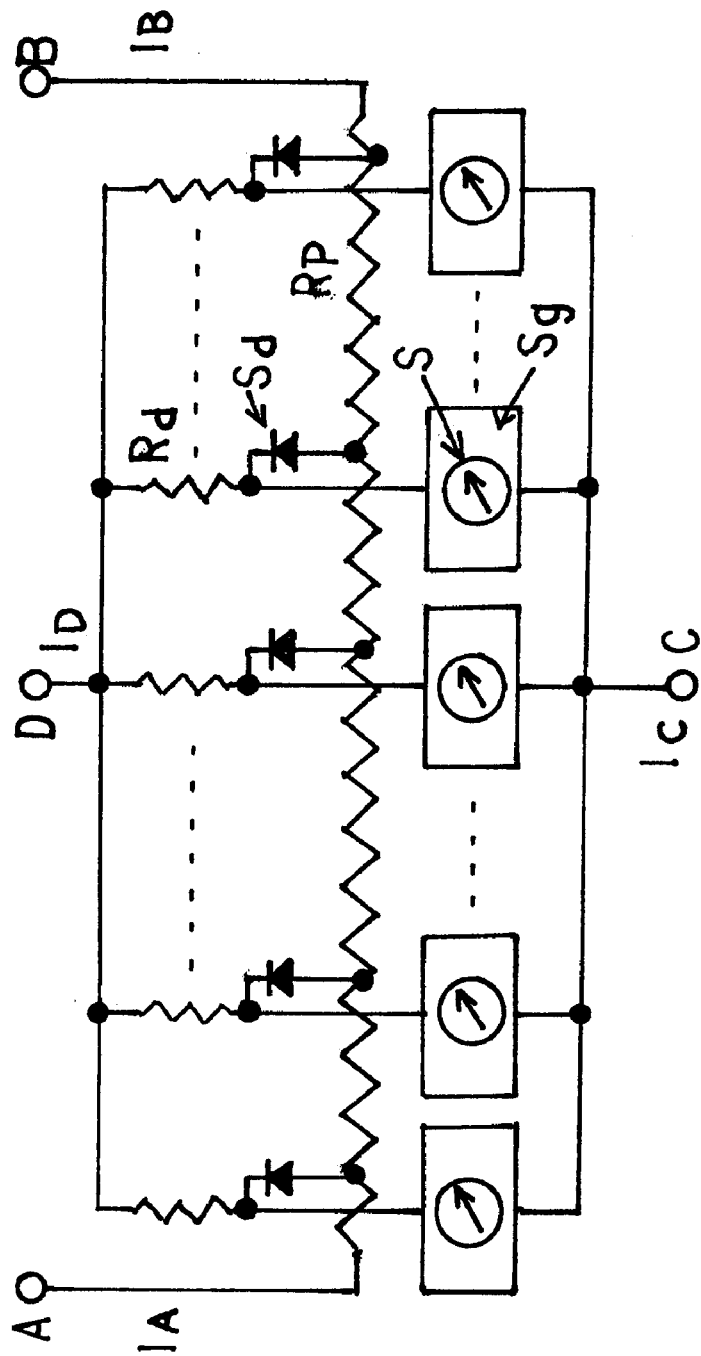
FIG. 5 is a conceptual diagram showing an example of equivalent circuit exhibiting a principle of a semiconductor dark image position sensitive device according to the present invention wherein the semiconductor dark image position sensitive device is the one of a separate photoelectric device type.

It is to be noted that the same or equivalent components as or to those of FIGS. 1 through 3 are designated by the same reference characters in FIGS. 4 and 5 wherein the detailed description relating thereto will be omitted.

Namely, an example of preferred embodiments of a semiconductor dark image position sensitive device according to the present invention is shown in FIG. 4 wherein the semiconductor dark image position sensitive device is provided with dividing resistances composed of resistive elements Rd divided to be disposed in every predetermined sections of a photoelectric layer S so as to be, as a second resistive element, a replenishing means for replenishing an insufficient amount of photoelectric current in such that a distribution of an electric current flowing through a resistive element layer $R_P$ becomes substantially uniform with respect to a photoelectric current which is generated in the photoelectric layer S in response to light input and flows into the resistive element layer $R_P$ in response to a position of the light input in the photoelectric layer S.

In FIG. 4, reference character D designates a bias terminal, $I_d$ a bias electric current output from the bias terminal D, and Sd a diode for preventing interference, respectively.

Accordingly, the semiconductor dark image position sensing device is arranged in such that an electric current for replenishing an insufficient amount of a photoelectric current is supplied from the resistive element Rd corresponding to a position of light input in the photoelectric layer S in the respective resistive elements Rd composed of a dividing resistance, and a replenishing electric current for replenishing an insufficient amount of the photoelectric current is distributed in response to a resistance value defined between a position of light input, that is, a portion of the resistive element Rd in a position corresponding to that where the photoelectric current flows into the resistive element layer $R_P$ and the signal current output terminals A and B, whereby the electric current is sensed as a signal electric current from the signal current output terminals A and B.

In this respect, it is desired to set magnitude of the resistive element layer $R_P$ and the resistive element Rd as follows.

$$R_P << Rd$$

Figures 6A, 6B:
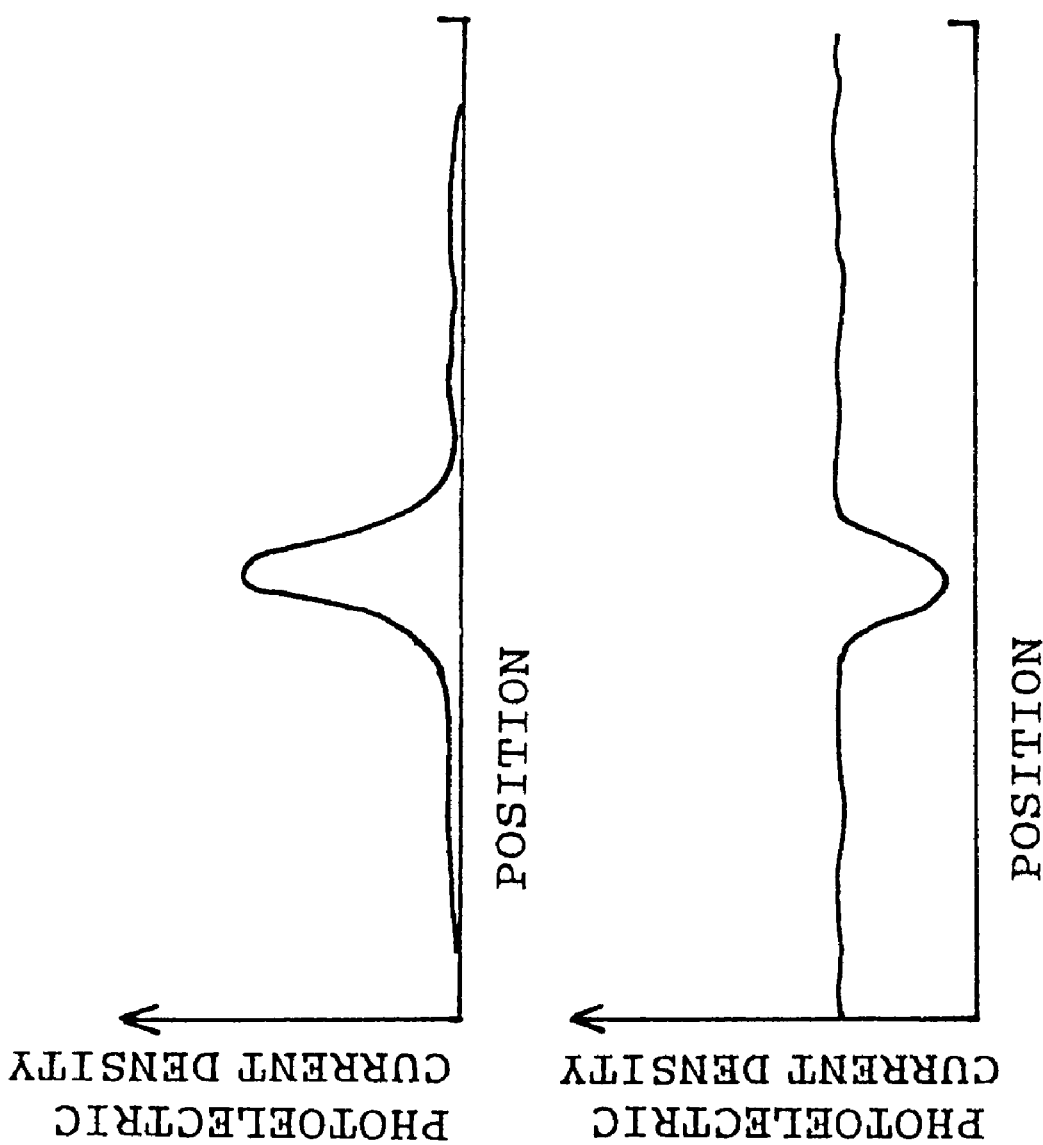
FIG. 6(a) is a conceptual diagram showing a distribution of photoelectric current density in the case when a spot image is sensed by the use of a conventional semiconductor image position sensitive device.
FIG. 6(b) is a conceptual diagram showing a distribution of photoelectric current density in the case when a dark point image is sensed by the use of a semiconductor image position sensitive device according to the present invention.

FIG. 6(a) is a conceptual diagram showing a distribution of photoelectric density in the case where a spot image is sensed by the use of a conventional semiconductor image position sensing device, while FIG. 6(b) is a conceptual diagram showing a distribution of photoelectric current in the case where a dark point image is sensed by utilizing a preferred embodiment of the invention as described above.

Figures 7A, 7B:
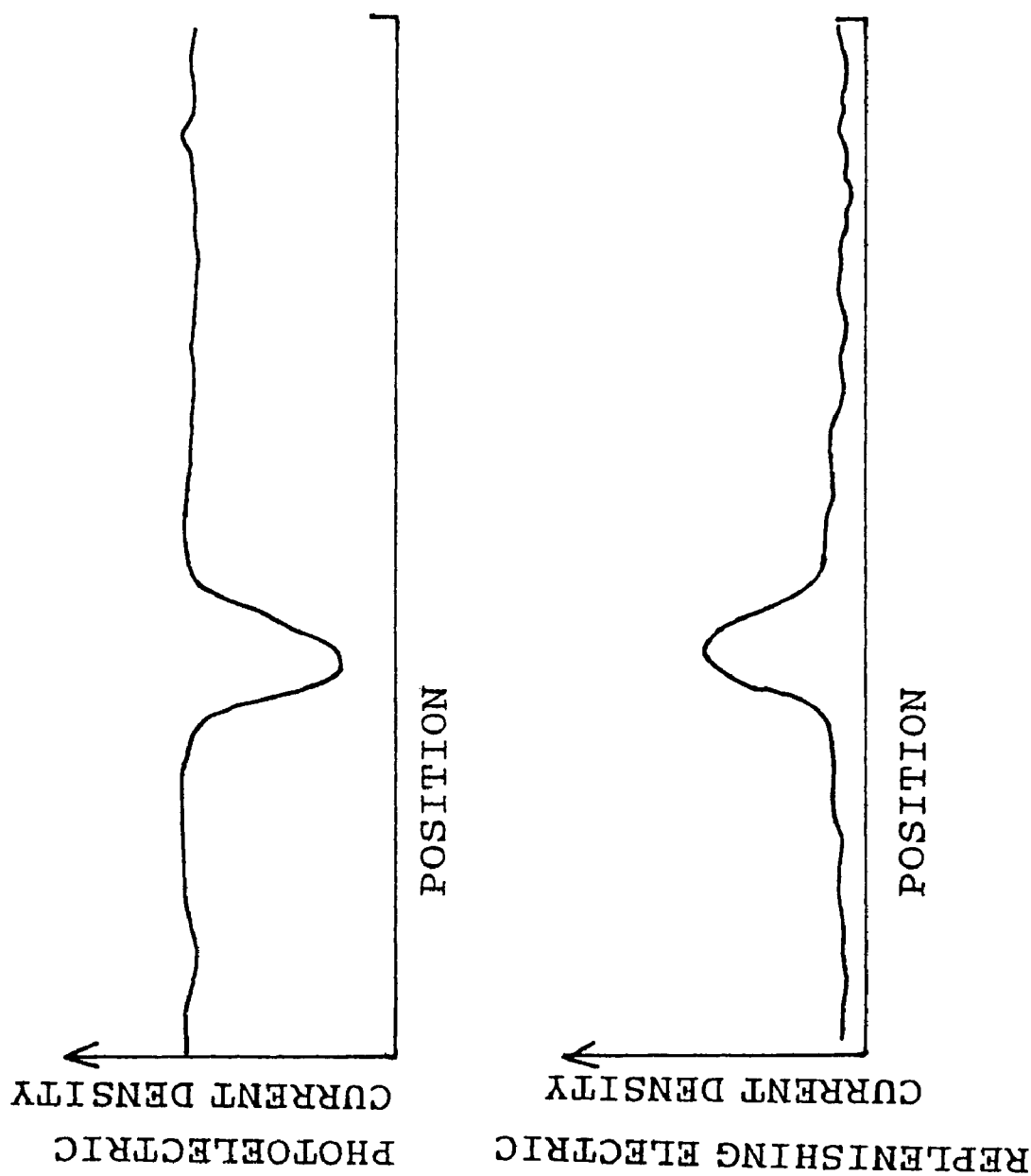
FIG. 7(a) is a conceptual diagram showing a distribution of photoelectric current density in the case when a dark point image is sensed by the use of a semiconductor dark image position sensitive device according to the present invention.
FIG. 7(b) is a conceptual diagram showing a distribution of replenishing electric current density in the case when a dark point image is sensed by the use of a semiconductor dark image position sensitive device according to the present invention.

Furthermore, FIG. 7(a) is a conceptual diagram showing a distribution of photoelectric density in the case where a dark point image is sensed by utilizing a preferred embodiment as described above, while FIG. 7(b) is a conceptual diagram showing a distribution of replenishing electric current density in the case where a dark point image is sensed by utilizing a preferred embodiment of the invention as described above.

Since such replenishing electric current as described above is distributed in accordance with a resistance value defined between a position where a replenishing electric current flows into dividing resistances and the signal current output terminals A and B, an output current from the signal current output terminals A and B is calculated in accordance with the same manner as that in case of a conventional semiconductor image position sensing device, whereby a position of dark point image can be calculated.

FIG. 5 is an equivalent circuit showing another example of preferred embodiments of a semiconductor dark image sensing device according to the present invention wherein a photoelectric layer S of the semiconductor dark image position sensing device is composed of a separate photoelectric layer Sg.

A semiconductor dark image position sensitive device which acts more truly in accordance with the principle as described above in view of a manufacturing process can be more easily realized in the case where the photoelectric layer S is formed as separate photoelectric layers Sg as shown in FIG. 5 than the case where the photoelectric layer S shown in FIG. 4 is continuous.

It is to be noted that when a diode Sd for preventing interference is inserted in a circuit, it becomes possible to avoid interference appearing on portions adjacent with each other in the case where a replenishing electric current flows thereinto.

Since the present invention has been constituted as described above, there is an advantage to provide a semiconductor dark image position sensitive device which can sense easily at high-speed a dark image position in a bright field of view, i.e., a position of a dark target point (dark image) set in a bright background as in the case of sensing a spot position in accordance with a conventional semiconductor image position sensing device.

It will be appreciated by those of ordinary skill in the art that the present invention can be embodied in other specific forms without departing from the spirit or essential characteristics thereof.

The presently disclosed embodiments are therefore considered in all respects to be illustrated and not restrictive. The scope of the invention is indicated by the appended claims rather than the foregoing description, and all changes that come within the meaning and range of equivalents thereof are intended to be embraced therein.

The entire disclosure of Japanese Patent Application No. 10-330362 filed on Nov. 20, 1998 including specification, claims, drawings and summary are incorporated herein by reference in its entirety.

What is claimed is:

1. A semiconductor dark image position sensing device, comprising a photoelectric layer generating a photoelectric current in a portion where light is input in response to intensity of the light input, a resistive element layer into which said photoelectric current generated in said photoelectric layer flows from a portion corresponding to said position of light input, a second resistive element disposed in association with said photoelectric layer for replenishing an insufficient amount of electric current with respect to said photoelectric current so as to flow the same into the resistive element layer in such that a distribution of electric current flowing into said resistive element layer corresponding to said position of light input becomes substantially uniform over a whole sensing region, and signal electric current output terminals disposed at the opposite ends of said second resistive element; wherein the electric current for replenishing an insufficient amount of said photoelectric current is supplied from a portion corresponding to a position where said photoelectric current in said second resistive element flows into said resistive element layer, the electric current for replenishing an insufficient amount of said photoelectric current is distributed at a ratio in response to a resistance value defined between a portion for supplying the electric current for replenishing an insufficient amount of said photoelectric current on said second resistive element and said signal current output terminals, and the electric current is output from the signal current output terminals as an electric current which is summed over the whole region of a section to which is supplied an insufficient amount of said photoelectric current.

2. A semiconductor dark image position sensitive device as claimed in claim 1, wherein a site of said photoelectric layer in which a photoelectric current is generated in response to intensity of light is separated into plural portions and each of which acts as an independent photoelectric device, and photoelectric currents generated in said photoelectric devices separated into the plural portions flow into said resistive element layers corresponding to respective positions.

* * * * *